(12) United States Patent
Maekawa et al.

(10) Patent No.: US 11,401,609 B2
(45) Date of Patent: Aug. 2, 2022

(54) FILM FORMING METHOD AND FILM FORMING SYSTEM

(71) Applicant: TOKYO ELECTRON LIMITED, Tokyo (JP)

(72) Inventors: Koji Maekawa, Nirasaki (JP); Katsumasa Yamaguchi, Nirasaki (JP); Takashi Sameshima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 190 days.

(21) Appl. No.: 16/553,602

(22) Filed: Aug. 28, 2019

(65) Prior Publication Data

US 2020/0071829 A1     Mar. 5, 2020

(30) Foreign Application Priority Data

Aug. 31, 2018 (JP) .............................. JP2018-163400

(51) Int. Cl.
*H01L 21/285* (2006.01)
*C23C 16/455* (2006.01)
*C23C 16/34* (2006.01)

(52) U.S. Cl.
CPC ........ *C23C 16/45553* (2013.01); *C23C 16/34* (2013.01); *H01L 21/28556* (2013.01)

(58) Field of Classification Search
None
See application file for complete search history.

(56) References Cited

U.S. PATENT DOCUMENTS

2019/0221434 A1*  7/2019  Sameshima ....... H01L 21/76831

FOREIGN PATENT DOCUMENTS

| JP | 2004536225 A | 12/2004 |
|---|---|---|
| JP | 2011151356 A | 8/2011 |
| JP | 2017008412 A | 1/2017 |
| JP | 2019160918 A | 9/2019 |
| KR | 100557964 B1 | 2/2006 |
| KR | 1020080101745 A | 11/2008 |

* cited by examiner

*Primary Examiner* — Jack S Chen
(74) *Attorney, Agent, or Firm* — Nath, Goldberg & Meyer; Jerald L. Meyer; Tanya E. Harkins

(57) ABSTRACT

A film forming method includes forming a cancel layer on a substrate, which is disposed within a processing container and on which a base film is formed, in a pressure-reduced atmosphere, the cancel layer cancelling orientation of the base film, forming an initial metal film by supplying a metal material gas and a boron-containing gas to the substrate on which the cancel layer is formed, and forming a main metal film on the substrate on which the initial metal film is formed.

14 Claims, 15 Drawing Sheets

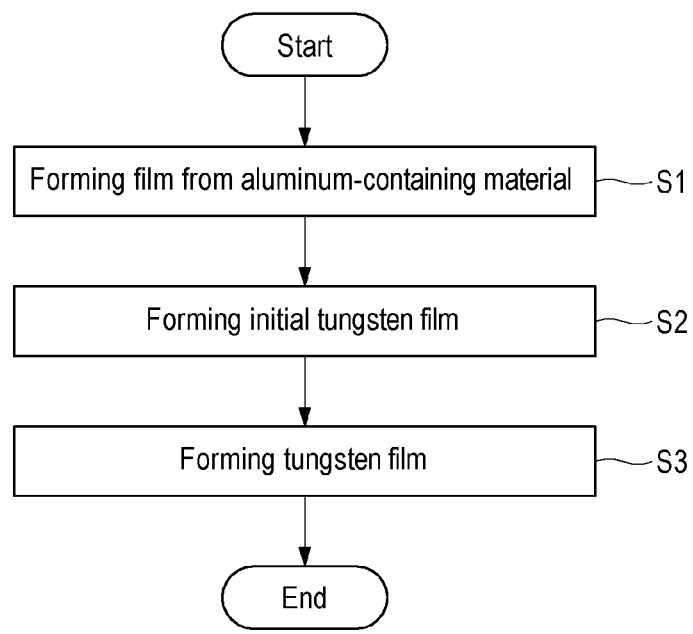

FILM FORMING METHOD AND FILM FORMING SYSTEM

CROSS-REFERENCE TO RELATED APPLICATION

This application is based upon and claims the benefit of priority from Japanese Patent Application No. 2018-163400, filed on Aug. 31, 2018, the entire contents of which are incorporated herein by reference.

TECHNICAL FIELD

The present disclosure relates to a film forming method and a film forming system.

BACKGROUND

Patent Document 1 proposes a technique for forming a tungsten film as a metal layer on a substrate. In Patent Document 1, prior to forming a tungsten film as a main film, a nucleation step in which a reducing agent, such as $PH_3$ or $B_2H_6$, and a tungsten-containing compound, such as $WF_6$, are introduced is performed in order to facilitate uniform formation of a tungsten film.

PRIOR ART DOCUMENT

Patent Document

[Patent Document 1] Japanese Patent Laid-Open Publication No. 2004-536225

SUMMARY

According to one aspect of the present disclosure, a film forming method includes forming a cancel layer on a substrate, which is disposed within a processing container and on which a base film is formed, in a pressure-reduced atmosphere, the cancel layer cancelling orientation of the base film, forming an initial metal film by supplying a metal material gas and a boron-containing gas to the substrate on which the cancel layer is formed, and forming a main metal film on the substrate on which the initial metal film is formed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a flowchart illustrating a flow of respective steps of a film forming method according to an embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Configuration of System]

Figure 1:
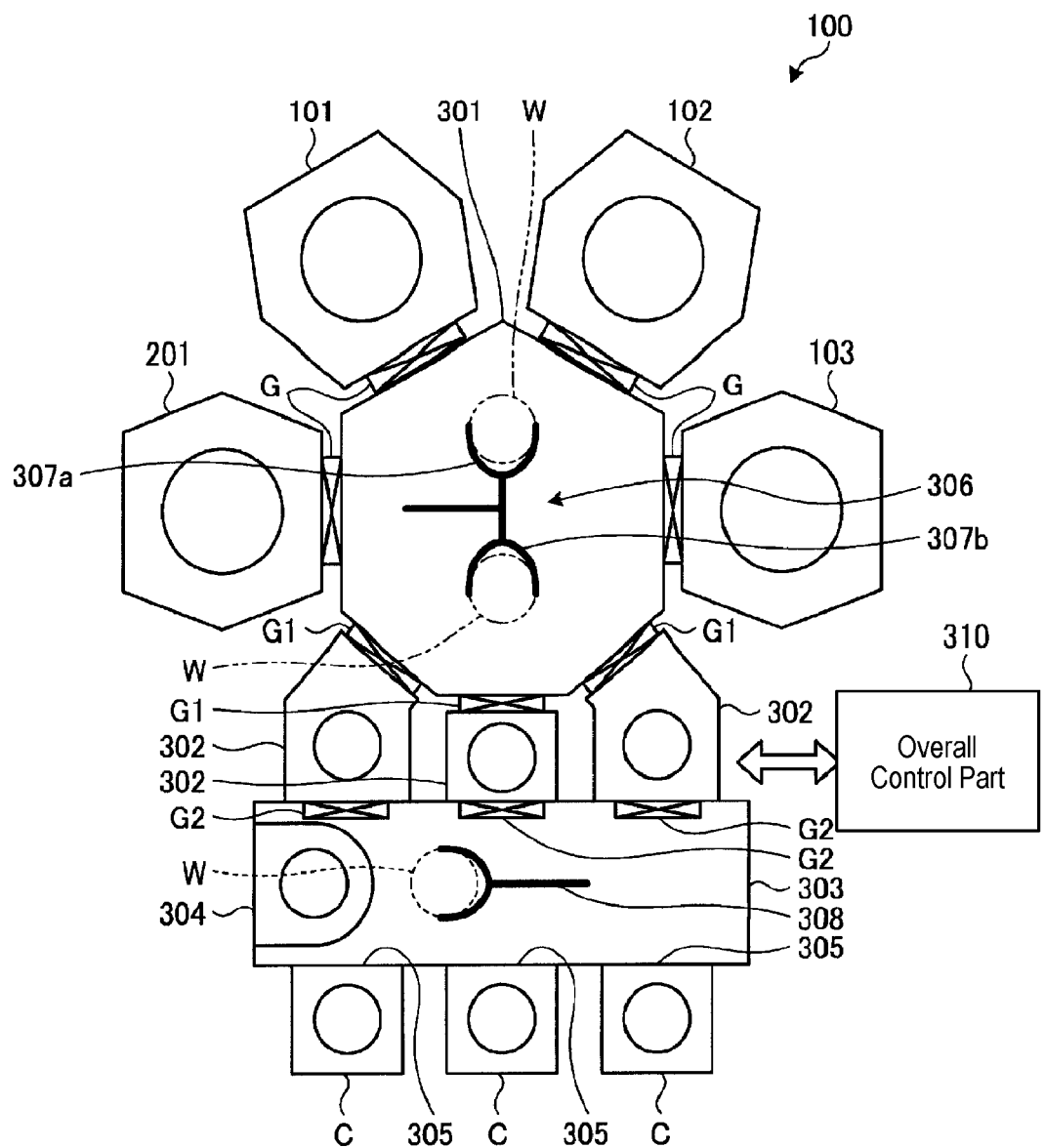
FIG. 1 is a view illustrating an example of the overall schematic configuration of a film forming system according to an embodiment.

In the present embodiment, a case in which film formation is performed by a film forming system using a plurality of film forming apparatuses will be described as an example. First, a film forming system according to the present embodiment will be described. FIG. 1 is a view illustrating an example of the overall schematic configuration of a film forming system according to an embodiment. The film forming system 100 includes a first film forming apparatus 101, a second film forming apparatus 102, a third film forming apparatus 103, and a base-film forming apparatus 201. In the film forming system 100 according to an embodiment, the base-film forming apparatus 201 is used for forming a base film, and the first film forming apparatus 101 is used for forming a film of an aluminum-containing material, and the second film forming apparatus 102 and the third film forming apparatus 103 are used for forming a metal layer. A transfer mechanism is connected to the first film forming apparatus 101, the second film forming apparatus 102, the third film forming apparatus 103, and the base-film forming apparatus 201, and a substrate to be processed as a film forming object is transferred by a transfer mechanism.

The film forming system 100 forms a base film on a substrate. For example, the film forming system 100 forms a titanium nitride film (TiN) as a base film. Next, the film forming system 100 forms, on the substrate, a cancel layer that cancels the orientation of the base film. For example, the film forming system 100 forms a film of an aluminum-containing material as a cancel layer. Next, the film forming system 100 forms a metal layer. For example, the film forming system 100 forms a tungsten film as a metal layer. Although the case of forming a tungsten film as the metal layer will be described below by way of an example, the present disclosure is not limited thereto. The film forming system 100 may form a metal layer containing any of Cu (copper), Co (cobalt), Ru (ruthenium), and Mo (molybdenum).

As illustrated in FIG. 1, the film forming system 100 includes a base-film forming apparatus 201 that forms a titanium nitride film (TiN), a first film forming apparatus 101 that forms a film of an aluminum-containing material, a second film forming apparatus 102 that forms an initial tungsten film as a metal layer, and a third film forming apparatus 103 that forms a main tungsten film as a metal layer. These apparatuses are connected to the four walls of a vacuum transfer chamber 301 having a heptagonal shape in a plan view via gate valves G, respectively. The inside of the vacuum transfer chamber 301 is evacuated by a vacuum pump and is maintained at a predetermined degree of vacuum. That is, the film forming system 100 is a multi-chamber-type vacuum processing system, and is capable of continuously forming a tungsten film without breaking the vacuum. That is, all of the steps performed in the processing containers of the base-film forming apparatus 201, the first film forming apparatus 101, the second film forming apparatus 102, and the third film forming apparatus 103 are performed on a silicon wafer W (hereinafter referred to as "wafer W") without having the silicon wafer to be exposed to the air atmosphere.

The configurations of the first film forming apparatus 101, the second film forming apparatus 102, and the third film forming apparatus 103 will be described later. The base-film forming apparatus 201 is an apparatus that forms a titanium nitride film (TiN) by alternately supplying, for example, a Ti-containing gas and an N-containing gas onto the wafer W through atomic layer deposition (ALD) in a chamber of a vacuum atmosphere. Examples of the Ti-containing gas include, for example, $TiCl_4$, tetrakis (dimethylamino) titanium (TDMAT: $Ti[N(CH_3)_2]_4$) gas), and tetrakis (methyl ethyl amino) titanium (TMEAT: $C_{12}H_{32}N_4Ti$) gas. Examples of the N-containing gas include, for example, $N_2$, $NH_3$, hydrazine ($N_2H_4$), and monomethylhydrazine (MMH: $CH_3(NH)NH_2$). For example, the base-film forming apparatus 201 forms a titanium nitride film (TiN) on the wafer W by alternately supplying $TiCl_4$ gas and $NH_3$ gas.

Three load-lock chambers 302 are connected to the other three walls of the vacuum transfer chamber 301 through gate valves G1. An atmospheric transfer chamber 303 is provided on the side opposite to the vacuum transfer chamber 301 with load-lock chambers 302 interposed therebetween. The three load-lock chambers 302 are connected to the atmospheric transfer chamber 303 via gate valves G2. The load-lock chambers 302 perform pressure control between atmospheric pressure and vacuum when a wafer W is transferred between the atmospheric transfer chamber 303 and the vacuum transfer chamber 301.

In a wall of the atmospheric transfer chamber 303 opposite to the wall of the atmospheric transfer chamber 303 on which the load-lock chambers 302 are mounted, three carrier-mounting ports 305 are provided, in which a carrier (a FOUP or the like) C accommodating a wafer W therein is positioned. In addition, on the side wall of the atmospheric transfer chamber 303, an alignment chamber 304 is provided to perform alignment of a wafer W. In the atmospheric transfer chamber 303, a downflow of clean air is formed.

In the vacuum transfer chamber 301, a first substrate transfer mechanism 306 is provided. The transfer mechanism 306 transfers a substrate W to the base-film forming apparatus 201, the first film forming apparatus 101, the second film forming apparatus 102, the third film forming apparatus 103, and the load-lock chambers 302. The transfer mechanism 306 has two independently movable transfer arms 307a and 307b.

In the atmospheric transfer chamber 303, a transfer mechanism 308 is provided. The transfer mechanism 308 transfers a wafer W to the carriers C, the load-lock chambers 302, and the alignment chamber 304.

The film forming system 100 has an overall control part 310. The overall control part 310 is configured as, for example, a computer, and includes a main control part such as a CPU, an input device (e.g., a keyboard or a mouse), an output device (e.g., a printer), a display device (e.g., a display), and a storage device (e.g., a storage medium). The main control part controls each component of the base-film forming apparatus 201, the first film forming apparatus 101, the second film forming apparatus 102, and the third film forming apparatus 103. In addition, the main control part controls, for example, driving systems for the exhaust mechanism, the gas supply mechanism, and the transfer mechanism 306 of the vacuum transfer chamber 301, the exhaust mechanisms and the gas supply mechanisms of the load-lock chambers 302, the transfer mechanism 308 of the atmospheric transfer chamber 303, and the gate valves G, G1, and G2. The main control part of the overall control part 310 causes the film forming system 100 to execute a predetermined operation on the basis of, for example, a processing recipe stored in, for example, a storage medium embedded in a storage device or a storage medium set in a storage device. In addition, the overall control part 310 may be a higher control part of each control part of each unit such as a control part 6 included in the first film forming apparatus 101, the second film forming apparatus 102, and the third film forming apparatus 103 described later.

Next, the operation of the film forming system 100 configured as described above will be described. The following processing operations are executed on the basis of the processing recipes stored in a storage medium in the overall control part 310.

First, a wafer W is taken from a carrier C connected to the atmospheric transfer chamber 303 by the transfer mechanism 308, and after passing through the alignment chamber 304, the gate valve G2 of any of the load-lock chambers 302 is opened, and the wafer W is loaded into the load-lock chamber 302. After closing the gate valve G2, the inside of the load-lock chamber 302 is evacuated.

When the load-lock chamber 302 reaches a predetermined degree of vacuum, the gate valve G1 is opened, and the wafer W is taken out from the load-lock chamber 302 by any of the transfer arms 307a and 307b of the transfer mechanism 306.

Then, the gate valve G of the base-film forming apparatus 201 is opened, and the wafer W held by any one transfer arm of the transfer mechanism 306 is loaded into the base-film forming apparatus 201, the empty transfer arm is returned to the vacuum transfer chamber 301, and the gate valve G is closed. Then, the base-film forming apparatus 201 performs a film forming process of a titanium nitride film (TiN).

After completion of the film forming process of the titanium nitride film (TiN), the gate valve G of the base-film forming apparatus 201 is opened, and the wafer W in the base-film forming apparatus 201 is unloaded by either of the transfer arms 307a and 307b of the transfer mechanism 306. Then, the gate valve G of the first film forming apparatus 101 is opened, the wafer W held by the transfer arm is loaded into the first film forming apparatus 101, the empty transfer arm is returned to the vacuum transfer chamber 301, and the gate valve G is closed. Then, a film forming process of an aluminum-containing material is performed on the titanium nitride film (TiN) formed on the wafer W by the first film forming apparatus 101.

After completion of the film forming process of the aluminum-containing material, the gate valve G of the first film forming apparatus 101 is opened, and the wafer W in the first film forming apparatus 101 is unloaded by either of the transfer arms 307a and 307b of the transfer mechanism 306. Then, the gate valve G of the second film forming apparatus 102 is opened, the wafer W held by the transfer arm is loaded into the second film forming apparatus 102, the empty transfer arm is returned to the vacuum transfer chamber 301, and the gate valve G is closed. Then, the second film forming apparatus 102 performs a film forming process of an initial tungsten film on the aluminum-containing material formed on the wafer W.

After completion of the film forming process of the initial tungsten film, the gate valve G of the second film forming apparatus 102 is opened, and the wafer W is unloaded by either of the transfer arms 307a and 307b of the transfer mechanism. Then, the gate valve G of the third film forming apparatus 103 is opened, the wafer W held by the transfer arm is loaded into the third film forming apparatus 103, the empty transfer arm is returned to the vacuum transfer chamber 301, and the gate valve G is closed. Then, a film forming process of a main tungsten film is performed on the wafer W by the third film forming apparatus 103.

After completion of the film forming process of the main tungsten film, the gate valve G of the third film forming apparatus 103 is opened, and the wafer W is unloaded by either of the transfer arms 307a and 307b of the transfer mechanism 306. Then, the gate valve G1 of any of the load-lock chambers 302 is opened, and the wafer W on the transfer arm is loaded into the load-lock chamber 302. Then, the inside of the load lock chamber 302 is returned to the air atmosphere, the gate valve G2 is opened, and the wafer W in the load-lock chamber 302 is returned to the carrier C by the transfer mechanism 308.

The processes described above are simultaneously performed on a plurality of wafers W in parallel to complete the film forming processes of a tungsten film on a predetermined number of wafers W.

Thus, the film forming system 100 is capable of realizing the film formation of the base film, the cancel layer, the initial tungsten film, and the main tungsten film with high throughput. In addition, the film forming system 100 of this example is illustrated as a vacuum-processing system equipped with four film forming apparatuses. However, as long as the film forming system 100 is a vacuum processing system which can be equipped with multiple film forming apparatuses, the number of film forming apparatuses is not limited to four, but may be four or more. For example, the film forming system 100 may be a vacuum-processing system equipped with eight or more film forming apparatuses.

[Configuration of Film Forming Apparatus]

The configurations of the first film forming apparatus 101, the second film forming apparatus 102, and the third film forming apparatus 103 have substantially the same configuration. Herein below, the configuration of the first film forming apparatus 101 is mainly described, and only parts different from the first film forming apparatus 101 will be described regarding the configurations of the second film forming apparatus 102 and the third film forming apparatus 103.

Figure 2:
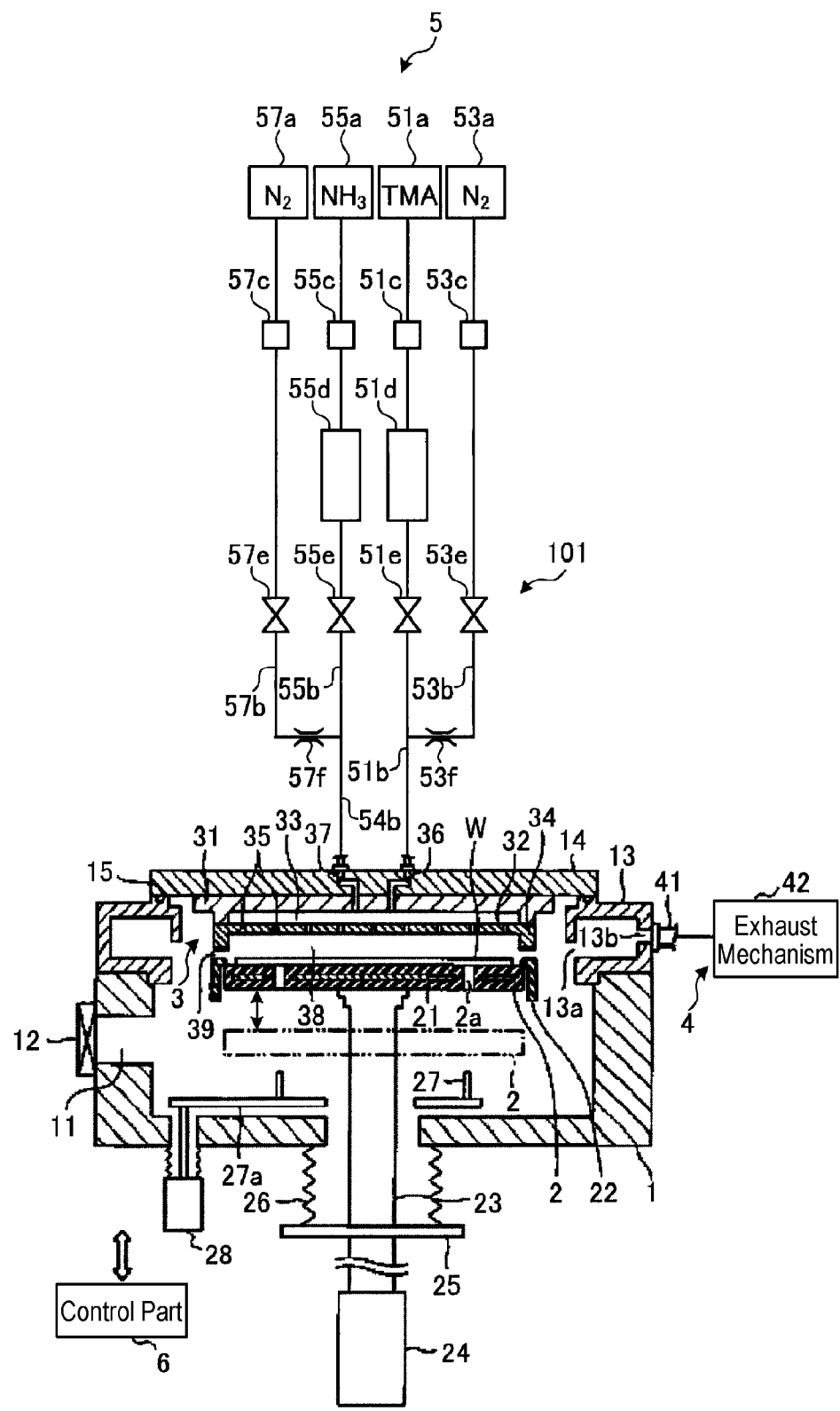
FIG. 2 is a schematic cross-sectional view of a first film forming apparatus according to an embodiment.

The configuration of the first film forming apparatus 101 will be described. FIG. 2 is a schematic cross-sectional view of the first film forming apparatus according to an embodiment. The first film forming apparatus 101 has a processing container 1, a mounting table 2, a shower head 3, an exhaust part 4, a gas supply mechanism 5, and a control part 6.

The processing container 1 is made of a metal such as aluminum and has a substantially cylindrical shape. A wafer W as a substrate to be processed is loaded into the processing container 1. A loading/unloading port 11 is formed in the side wall of the processing container 1 to load/unload a wafer W therethrough, and is opened and closed by a gate valve 12. An annular exhaust duct 13 having a rectangular cross section is provided on the main body of the processing container 1. A slit 13a is formed in the exhaust duct 13 along the inner peripheral surface of the exhaust duct 13. An exhaust port 13b is formed in the outer wall of the exhaust duct 13. On the upper surface of the exhaust duct 13, a ceiling wall 14 is provided so as to cover the upper opening of the processing container 1. The exhaust duct 13 and the ceiling wall 14 are hermetically sealed each other with a seal ring 15.

The mounting table 2 horizontally supports the wafer W in the processing container 1. The mounting table 2 is formed in a disk shape having a size corresponding to the wafer W, and is supported by a support member 23. The mounting table 2 is formed of a ceramic material such as aluminum nitride (AlN) or a metal such as aluminum or nickel alloy, and a heater 21 is embedded in the mounting table 2 in order to heat the wafer W. The heater 21 is fed with power from a heater power supply (not illustrated) and generates heat. Then, the wafer W is controlled to a predetermined temperature by controlling the output of the heater 21 based on a temperature signal of a thermocouple (not illustrated) provided in the vicinity of the upper surface of the mounting table 2. The mounting table 2 is provided with a cover member 22 formed of ceramics such as alumina so as to cover the outer peripheral region of the upper surface and the side surface thereof.

A support member 23 is provided under the mounting table 2 to support the mounting table 2. The support member 23 extends to the lower side of the processing container 1 through a hole formed in the bottom wall of the processing container 1 from the center of the bottom surface of the mounting table 2, and the lower end of the support member 23 is connected to a lifting mechanism 24. The mounting table 2 ascends/descends by the lifting mechanism 24, via the support member 23, between the processing position illustrated in FIG. 2 and a transfer position (indicated by a two-dot chain line below the processing position) at which the wafer W is capable of being transferred. A flange part 25 is provided on the support member 23 below the processing container 1, and a bellows 26, which partitions the atmosphere in the processing container 1 from the outside air, is provided between the bottom surface of the processing container 1 and the flange part 25 to expand and contract in response to the ascending/descending movement of the mounting table 2.

Three wafer support pins 27 (only two are illustrated) are provided in the vicinity of the bottom surface of the processing container 1 so as to protrude upward from a lifting plate 27a. The wafer support pins 27 ascends and descends via the lifting plate 27a by a lifting mechanism 28 provided below the processing container 1. The wafer support pins 27 are inserted through the through holes 2a formed in the mounting table 2 located at the transfer position and are configured to protrude and retract with respect to the upper surface of the mounting table 2. By causing the wafer support pins 27 to ascend or descend, the wafer W is delivered between a wafer transfer mechanism (not illustrated) and the mounting table 2.

The shower head 3 supplies a processing gas into the processing container 1 in a shower form. The shower head 3 is made of a metal and is provided to face the mounting table 2. The shower head 3 has a diameter which is substantially equal to that of the mounting table 2. The shower head 3 has a main body part 31 fixed to the ceiling wall 14 of the processing container 1 and a shower plate 32 connected to the lower side of the main body part 31. A gas diffusion space 33 is formed between the main body part 31 and the shower plate 32. In the gas diffusion space 33, gas introduction holes 36 and 37 are provided through the center of the main body part 31 and the ceiling wall 14 of the processing container 1. An annular protrusion 34 protruding downward is formed on the peripheral edge portion of the shower plate 32. Gas ejection holes 35 are formed in the flat surface inside the annular protrusion 34. In the state in which the mounting table 2 is in the processing position, a processing space 38 is formed between the mounting table 2 and the shower plate 32, and the upper surface of the cover member 22 and the annular protrusion 34 are close to each other so as to form an annular gap 39. The exhaust part 4 evacuates the inside of the processing container 1. The exhaust part 4 includes an exhaust pipe 41 connected to the exhaust port 13b, and an exhaust mechanism 42 having, for example, a vacuum pump and a pressure control valve connected to the exhaust pipe 41. During the processing, the gas in the processing container 1 reaches the exhaust duct 13 via the slit 13a, and is exhausted from the exhaust duct 13 through the exhaust pipe 41 by the exhaust mechanism 42.

The gas supply mechanism 5 is connected to the gas introduction holes 36 and 37 so as to be able to supply various gases used for film formation. For example, the gas supply mechanism 5 includes an Al-containing gas supply source 51a, an $N_2$ gas supply source 53a, an $NH_3$ gas supply source 55a, and an $N_2$ gas supply source 57a as gas supply sources for forming a film of an aluminum-containing material. In addition, in the gas supply mechanism 5 illustrated in FIG. 2, although each gas supply source is illustrated as being individually divided, gas supply sources which can be commonly used may be consolidated.

The Al-containing gas supply source 51a supplies an Al-containing gas into the processing container 1 through a gas supply line 51b. Examples of the Al-containing gas include $AlCl_3$ gas and trimethylaluminum (TMA: $C_6H_{18}Al_2$) gas. The gas supply line 51b is provided with a flow rate controller 51c, a storage tank 51d, and a valve 51e from the upstream side. The downstream side of the valve 51e of the gas supply line 51b is connected to the gas introduction hole 36. The Al-containing gas supplied from the Al-containing gas supply source 51a is temporarily stored in the storage tank 51d before being supplied into the processing container 1, is pressurized to a predetermined pressure in the storage tank 51d, and is then supplied into the processing container 1. Supply and stop of the Al-containing gas from the storage tank 51d to the processing container 1 are performed by the valve 51e. By temporarily storing the Al-containing gas in the storage tank 51d as described above, it is possible to stably supply the Al-containing gas into the processing container 1 at a relatively large flow rate.

The $N_2$ gas supply source 53a supplies $N_2$ gas, which is a carrier gas and a purge gas, into the processing container 1 through the gas supply line 53b. The gas supply line 53b is provided with a flow rate controller 53c, a valve 53e, and an orifice 53f from the upstream side. The downstream side of the orifice 53f of the gas supply line 53b is connected to the gas supply line 51b. The $N_2$ gas supplied from the $N_2$ gas supply source 53a is continuously supplied into the processing container 1 during the film formation on the wafer W. Supply and stop of the $N_2$ gas from the $N_2$ gas supply source 53a to the processing container 1 are performed by the valve 53e. Although supply of the gas is made in the gas supply line 51b at a relatively large flow rate by the storage tank 51d, the gas supplied to the gas supply line 51b is prevented from flowing back to the gas supply line 53b by the orifice 53f.

The $NH_3$ gas supply source 55a supplies $NH_3$ gas, which is a reducing gas, into the processing container 1 through the gas supply line 55b. The gas supply line 55b is provided with a flow rate controller 55c, a storage tank 55d, and a valve 55e from the upstream side. The downstream side of the valve 55e of the gas supply line 55b is connected to the gas supply line 54b. The downstream side of the gas supply line 54b is connected to the gas introduction hole 37. The $NH_3$ gas supplied from the $NH_3$ gas supply source 55a is temporarily stored in the storage tank 55d before being supplied into the processing container 1, is pressurized to a predetermined pressure in the storage tank 55d, and is then supplied into the processing container 1. Supply and stop of the $NH_3$ gas from the storage tank 55d to the processing container 1 are performed by the valve 55e. By temporarily storing the $NH_3$ gas in the storage tank 55d as described above, it is possible to stably supply the $NH_3$ gas into the processing container 1 at a relatively large flow rate.

The $N_2$ gas supply source 57a supplies $N_2$ gas, which is a carrier gas and a purge gas, into the processing container 1 through the gas supply line 57b. The gas supply line 57b is provided with a flow rate controller 57c, a valve 57e, and an orifice 57f from the upstream side. The downstream side of the orifice 57f of the gas supply line 57b is connected to the gas supply line 54b. The $N_2$ gas supplied from the $N_2$ gas supply source 57a is continuously supplied into the processing container 1 during the film formation on the wafer W. Supply and stop of the $N_2$ gas from the $N_2$ gas supply source 57a to the processing container 1 are performed by the valve 57e. Although supply of the gas is made in the gas supply line 55b at a relatively large flow rate by the storage tank 55d, the gas supplied to the gas supply line 55b is prevented from flowing back to the gas supply line 57b by the orifice 57f.

The operation of the first film forming apparatus 101 configured as described above is centrally controlled by a control part 6. The control part 6 is, for example, a computer, and includes, for example, a central processing unit (CPU), a random access memory (RAM), a read only memory (ROM), and an auxiliary storage device. The CPU operates on the basis of a program stored in the ROM or an auxiliary storage device or and controls the overall operations of the apparatus. The control part 6 may be provided either inside or outside the first film forming apparatus 101. In the case in which the control part 6 is provided outside the first film forming apparatus 101, the control part 6 is capable of controlling the first film forming apparatus 101 through a wired or wireless communication mechanism.

Figure 3:
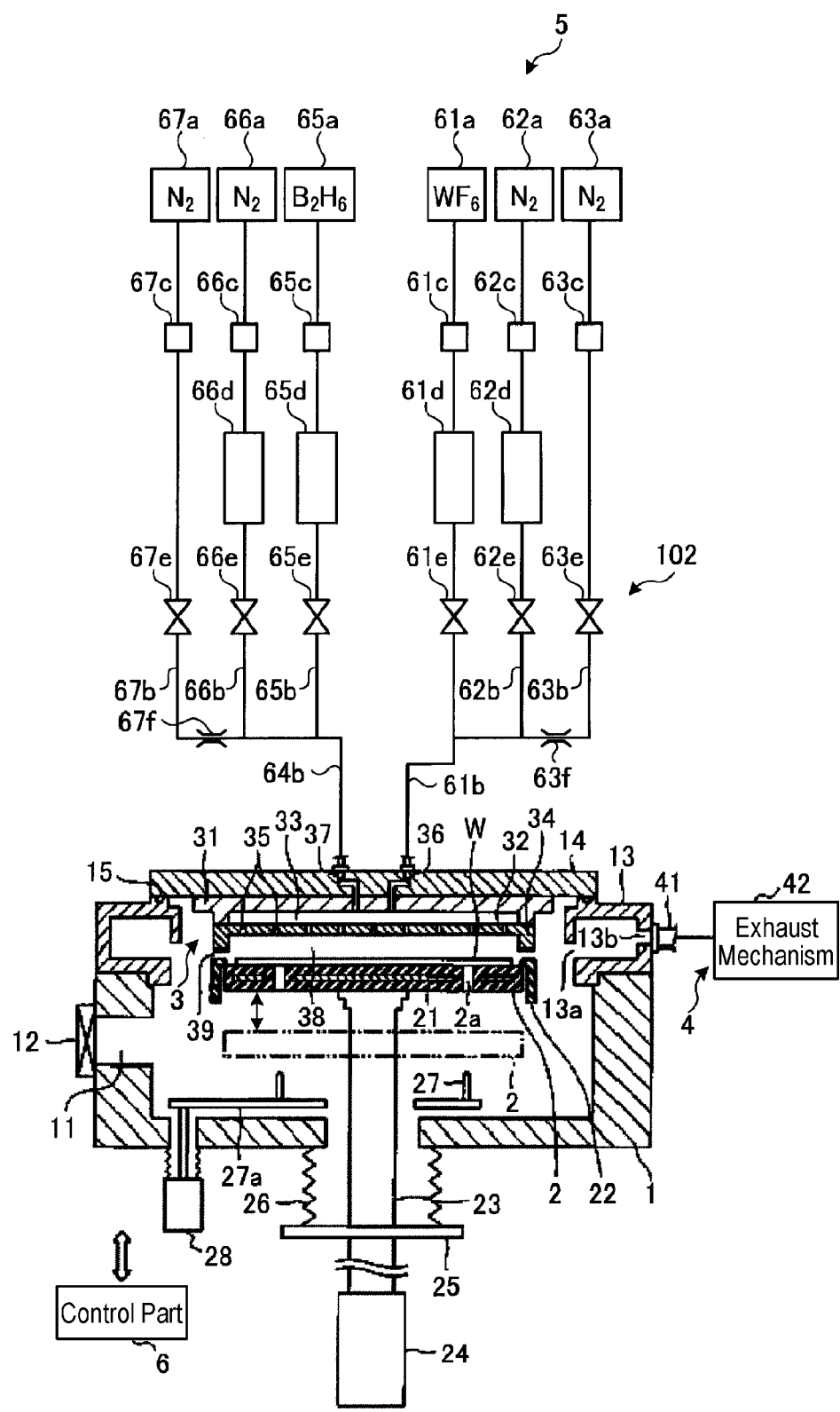
FIG. 3 is a schematic cross-sectional view of a second film forming apparatus according to an embodiment.

Next, the configuration of the second film forming apparatus 102 will be described. FIG. 3 is a schematic cross-sectional view of a second film forming apparatus according to an embodiment. The second film forming apparatus 102 has substantially the same configuration as the first film forming apparatus 101, except for the gases to be used and the gas supply mechanism 5. The components of the second film forming apparatus 102, which are the same as the components of the first film forming apparatus 101, will be denoted by the same reference numerals and points of the second film forming apparatus 102 different from the first film forming apparatus 101 will be mainly described.

The gas supply mechanism 5 is connected to the gas introduction holes 36 and 37 so as to be able to supply various gases to be used for film formation. For example, the gas supply mechanism 5 includes a metal material gas supply source 61a, an $N_2$ gas supply source 62a, and an $N_2$ gas supply source 63a as gas supply sources for forming an initial tungsten film. For example, the gas supply mechanism 5 includes a boron-containing gas supply source 65a, an $N_2$ gas supply source 66a, and an $N_2$ gas supply source 67a as gas supply sources for forming an initial tungsten film. In addition, in the gas supply mechanism 5 illustrated in FIG. 3, although each gas supply source is also individually divided and illustrated, gas supply sources, which are capable of being commonly used, may be consolidated.

The metal material gas supply source 61a supplies a metal material gas into the processing container 1 through a gas supply line 61b. Examples of the metal material gas are $WF_6$ gas and $WCl_x$ gas. For example, the metal material gas supply source 61a supplies $WF_6$ gas into the processing container 1. The gas supply line 61b is provided with a flow rate controller 61c, a storage tank 61d, and a valve 61e from the upstream side. The downstream side of the valve 61e of the gas supply line 61b is connected to the gas introduction hole 36. The $WF_6$ gas supplied from the metal material gas supply source 61a is temporarily stored in the storage tank 61d before being supplied into the processing container 1, is pressurized to a predetermined pressure in the storage tank 61d, and is then supplied into the processing container 1. Supply and stop of the $WF_6$ gas from the storage tank 61d to the processing container 1 are performed by the valve 61e. By temporarily storing the $WF_6$ gas in the storage tank 61d as described above, it is possible to stably supply the $WF_6$ gas into the processing container 1 at a relatively large flow rate.

The $N_2$ gas supply source 62a supplies $N_2$ gas, which is a purge gas, into the processing container 1 through the gas supply line 62b. The gas supply line 62b is provided with a flow rate controller 62c, a storage tank 62d, and a valve 62e from the upstream side. The downstream side of the valve 62e of the gas supply line 62b is connected to the gas supply line 61b. The $N_2$ gas supplied from the $N_2$ gas supply source 62a is temporarily stored in the storage tank 62d before being supplied into the processing container 1, is pressurized to a predetermined pressure in the storage tank 62d, and is then supplied into the processing container 1. Supply and stop of the $N_2$ gas from the storage tank 62d to the processing container 1 are performed by the valve 62e. By temporarily storing the $N_2$ gas in the storage tank 62d as described above, it is possible to stably supply the $N_2$ gas into the processing container 1 at a relatively large flow rate.

The $N_2$ gas supply source 63a supplies $N_2$ gas, which is a carrier gas, into the processing container 1 through the gas supply line 63b. The gas supply line 63b is provided with a flow rate controller 63c, a valve 63e, and an orifice 63f from the upstream side. The downstream side of the orifice 63f of the gas supply line 63b is connected to the gas supply line 61b. The $N_2$ gas supplied from the $N_2$ gas supply source 63a is continuously supplied into the processing container 1 during the film formation on the wafer W. Supply and stop of the $N_2$ gas from the $N_2$ gas supply source 63a to the processing container 1 are performed by the valve 63e. Although supply of the gases is made in the gas supply lines 61b and 62b at a relatively large flow rate by the storage tanks 61d and 62d, the gases supplied to the gas supply line 61b and 62b are prevented from flowing back to the gas supply line 63b by the orifice 63f.

The boron-containing gas supply source 65a supplies boron gas, which is a reducing gas, into the processing container 1 through the gas supply line 65b. Examples of the boron-containing gas may be $B_2H_6$ gas and BCl gas. For example, the boron-containing gas supply source 65a supplies $B_2H_6$ gas into the processing container 1. The gas supply line 65b is provided with a flow rate controller 65c, a storage tank 65d, and a valve 65e from the upstream side. The downstream side of the valve 65e of the gas supply line 65b is connected to the gas supply line 64b. The downstream side of the gas supply line 64b is connected to the gas introduction hole 37. The $B_2H_6$ gas supplied from the boron-containing gas supply source 65a is temporarily stored in the storage tank 65d before being supplied into the processing container 1, is pressurized to a predetermined pressure in the storage tank 65d, and is then supplied into the processing container 1. Supply and stop of the $B_2H_6$ gas from the storage tank 65d to the processing container 1 are performed by the valve 65e. By temporarily storing the $B_2H_6$ gas in the storage tank 65d as described above, it is possible to stably supply the $B_2H_6$ gas into the processing container 1 at a relatively large flow rate.

The $N_2$ gas supply source 66a supplies $N_2$ gas, which is a purge gas, into the processing container 1 through the gas supply line 66b. The gas supply line 66b is provided with a flow rate controller 66c, a storage tank 66d, and a valve 66e from the upstream side. The downstream side of the valve 66e of the gas supply line 66b is connected to the gas supply line 64b. The $N_2$ gas supplied from the $N_2$ gas supply source 66a is temporarily stored in the storage tank 66d before being supplied into the processing container 1, is pressurized to a predetermined pressure in the storage tank 66d, and is then supplied into the processing container 1. Supply and stop of the $N_2$ gas from the storage tank 66d to the processing container 1 are performed by the valve 66e. By temporarily storing the $N_2$ gas in the storage tank 66d as described above, it is possible to stably supply the $N_2$ gas into the processing container 1 at a relatively large flow rate.

The $N_2$ gas supply source 67a supplies $N_2$ gas, which is a carrier gas, into the processing container 1 through the gas supply line 67b. The gas supply line 67b is provided with a flow rate controller 67c, a valve 67e, and an orifice 67f from the upstream side. The downstream side of the orifice 67f of the gas supply line 67b is connected to the gas supply line 64b. The $N_2$ gas supplied from the $N_2$ gas supply source 67a is continuously supplied into the processing container 1 during the film formation on the wafer W. Supply and stop of the $N_2$ gas from the $N_2$ gas supply source 67a to the processing container 1 are performed by the valve 67e. Although supply of the gases is made in the gas supply lines 65b and 66b at a relatively large flow rate by the storage tanks 65d and 66d, the gases supplied to the gas supply line 65b and 66b are prevented from flowing back to the gas supply line 67b by the orifice 67f.

Figure 4:
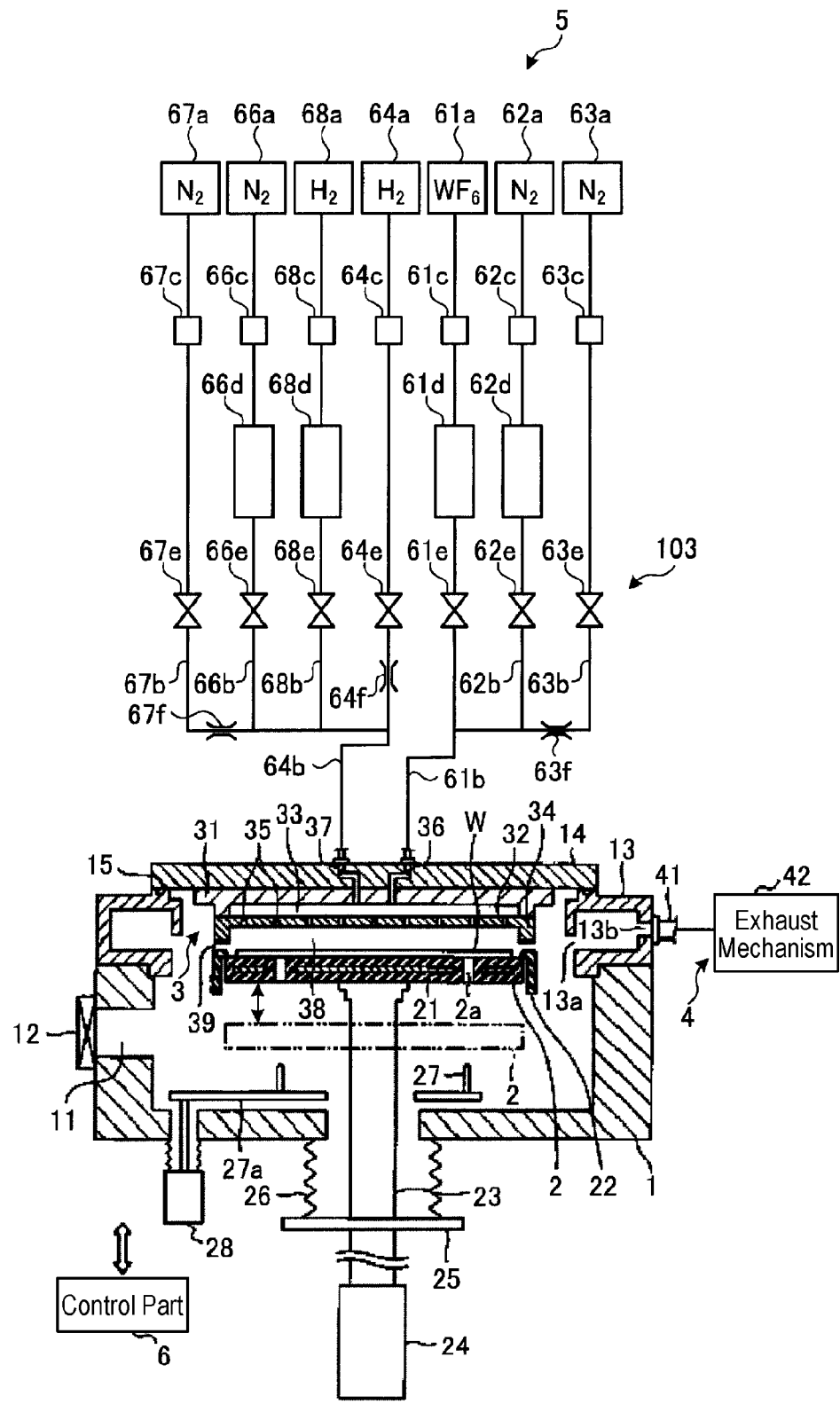
FIG. 4 is a schematic cross-sectional view of a third film forming apparatus according to an embodiment.

Next, the configuration of the third film forming apparatus 103 will be described. FIG. 4 is a schematic cross-sectional view of a third film forming apparatus according to an embodiment. The third film forming apparatus 103 have substantially the same configuration as the second film forming apparatus 102, except for the gases to be used and the gas supply mechanism 5. The components of the third film forming apparatus 103, which are the same as the components of the second film forming apparatus 102, will be denoted the same reference numerals and points of the third film forming apparatus 103 different from those of the second film forming apparatus 102 will be mainly described.

The gas supply mechanism 5 is connected to the gas introduction holes 36 and 37 so as to be able to supply various gases to be used for film formation. For example, like the second film forming apparatus 102, the gas supply mechanism 5 includes a metal material gas supply source 61a, an $N_2$ gas supply source 62a, an $N_2$ gas supply source 63a, an $N_2$ gas supply source 66a, and an $N_2$ gas supply source 67a as gas supply sources for forming a main tungsten film. The gas supply paths of the metal material gas supply source 61a, the $N_2$ gas supply source 62a, the $N_2$ gas supply source 63a, the $N_2$ gas supply source 66a, and the $N_2$ gas supply source 67a are configured similar to the second film forming apparatus 102. In addition, the gas supply mechanism 5 includes an $H_2$ gas supply source 64a and an $H_2$ gas supply source 68a as gas supply sources for forming the main tungsten film. In addition, in the gas supply mechanism 5 illustrated in FIG. 4, although each gas supply source is also individually divided and illustrated, gas supply sources, which can be commonly used, may be consolidated.

The $H_2$ gas supply source 64a supplies $H_2$ gas, which is a reducing gas, into the processing container 1 through the gas supply line 64b. The gas supply line 64b is provided with a flow rate controller 64c, a valve 64e, and an orifice 64f from the upstream side. The downstream side of the orifice 64f of the gas supply line 64b is connected to the gas introduction hole 37. The $H_2$ gas supplied from the $H_2$ gas supply source 64a is continuously supplied into the processing container 1 during the film formation on the wafer W. Supply and stop of the $H_2$ gas from the $H_2$ gas supply source 64a to the processing container 1 are performed by the valve 64e. Although supply of the gases is made in the gas supply lines 66b and 68b at a relatively large flow rate by the storage tanks 66d and 68d, the gases supplied to the gas supply line 66b and 68b are prevented from flowing back to the gas supply line 64b by the orifice 64f.

The $H_2$ gas supply source 68a supplies $H_2$ gas, which is a reducing gas, into the processing container 1 through the gas supply line 68b. The gas supply line 68b is provided with a flow rate controller 68c, a storage tank 68d, and a valve 68e from the upstream side. The downstream side of the valve 68e of the gas supply line 68b is connected to the gas supply line 64b. The $H_2$ gas supplied from the $H_2$ gas supply source 68a is temporarily stored in the storage tank 68d before being supplied into the processing container 1, is pressurized to a predetermined pressure in the storage tank 68d, and is then supplied into the processing container 1. Supply and stop of the $H_2$ gas from the storage tank 68d to the processing container 1 are performed by the valve 68e. By temporarily storing the $H_2$ gas in the storage tank 68d as described above, it is possible to stably supply the $H_2$ gas into the processing container 1 at a relatively large flow rate.

[Film Forming Method]

Next, a tungsten-film forming method, which is performed using the film forming system 100 configured as described above, will be described. FIG. 5 is a flowchart illustrating a flow of respective steps of a film forming method according to an embodiment. FIGS. 6A to 6D are cross-sectional views each schematically illustrating the states of wafers in respective steps of a film forming method according to an embodiment.

First, in the film forming method according to the present embodiment, for example, a wafer W in which a titanium nitride (TiN) film, which is a base film, is formed on the surface of a silicon film having a recess such as a trench and a hole (see FIG. 6A) is prepared. For example, in the film forming system 100, a titanium nitride film (TiN) is formed on a wafer W by the base-film forming apparatus 201. Although a recess such as a trench or a hole (a contact hole or a via hole) is actually formed in the wafer W, the recess is omitted in FIG. 6 for the sake of convenience.

Figure 6A:
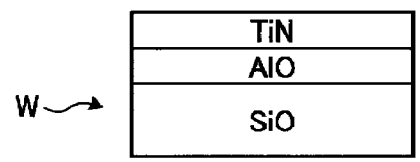
FIGS. 6A to 6D are cross-sectional views each schematically illustrating the states of wafers in respective steps of a film forming method according to an embodiment.
Figure 6B:
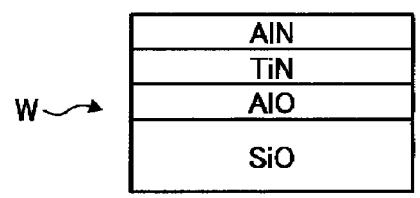

The first film forming apparatus 101 forms a film of an aluminum-containing material on the wafer W through atomic layer deposition (ALD) method (step S1: FIG. 6B). For example, the first film forming apparatus 101 supplies an Al-containing gas and a reducing gas into the processing container 1 so as to form an AlN film as a film of an aluminum-containing material. The details of steps of forming an AlN film will be described later.

Figure 6C:
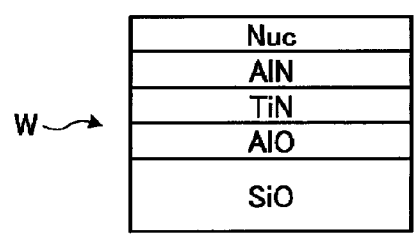

The second film forming apparatus 102 supplies $WF_6$ gas and $B_2H_6$ gas to the wafer W in the processing container 1 to generate the nucleus of tungsten on the surface of the wafer W so as to form a nucleation film as an initial tungsten film (step S2: FIG. 6C).

Figure 6D:
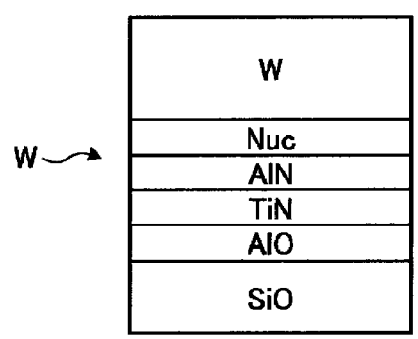

The third film forming apparatus 103 forms a main tungsten film on the wafer W (step S3: FIG. 6D). The details of steps of forming the main tungsten film will be described later.

[Formation of AlN Film]

Figure 7:
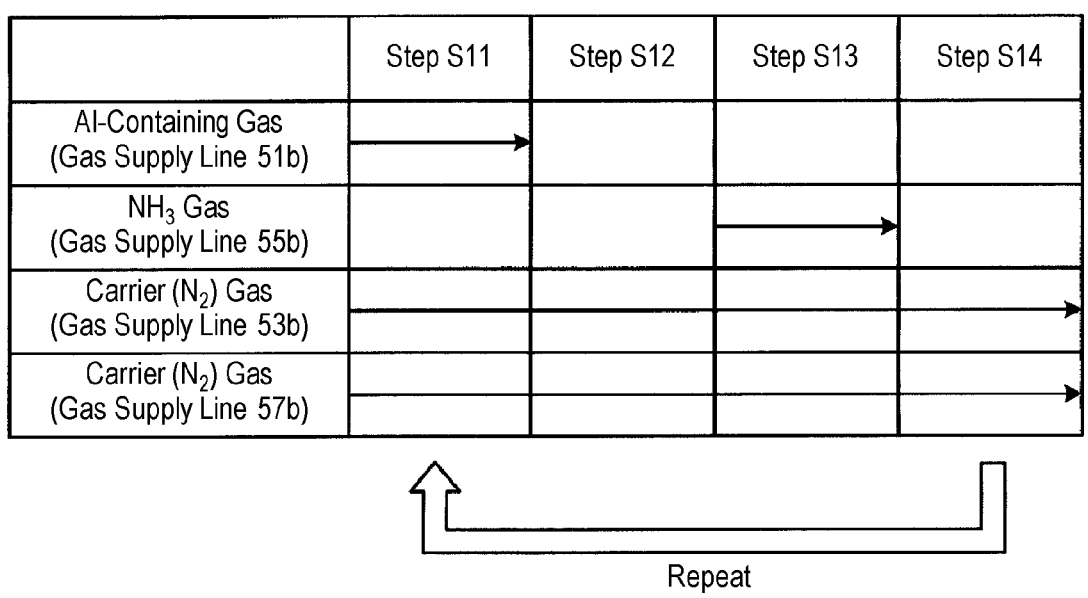
FIG. 7 is a view illustrating a gas supply sequence when forming an MN film according to an embodiment.

Next, a flow of forming an AlN film by the first film forming apparatus 101 will be described. FIG. 7 is a view illustrating a gas supply sequence when forming an AlN film according to an embodiment.

The control part 6 of the first film forming apparatus 101 controls the heater 21 of the mounting table 2 so as to heat a wafer W to a predetermined temperature (e.g., 250 to 650 degrees C.). In addition, the control part 6 controls the pressure control valve of the exhaust mechanism 42 so as to adjust the inside of the processing container 1 to a predetermined pressure (e.g., $1.3 \times 10^1$ to $8.0 \times 10^3$ Pa).

The control part 6 opens the valves 53e and 57e, and supplies a carrier gas ($N_2$ gas) of a predetermined flow rate (e.g., 100 to 10000 sccm) from the $N_2$ gas supply sources 53a and 57a to the gas supply lines 53b and 57b, respectively. In addition, the control part 6 supplies an Al-containing gas and $NH_3$ gas from the Al-containing gas supply source 51a and the $NH_3$ gas supply source 55a to the gas supply lines 51b and 55b, respectively. At this time, since the valves 51e and 55e are closed, the Al-containing gas and the NH3 gas are respectively stored in the storage tanks 51d and 55d, and the pressure in the storage tanks 51d and 55d is increased.

Next, the control part 6 opens the valve 51e so as to supply the Al-containing gas stored in the storage tank 51d into the processing container 1, and causes a film made of the aluminum-containing material to be formed on the surface of the wafer W (step S11).

After a predetermined time (e.g., 0.05 to 5 seconds) elapses after the valve 51e is opened, the control part 6 closes the valve 51e so as to stop the supply of the Al-containing gas into the processing container 1 (step S12). By closing the valve 51e, the Al-containing gas supplied from the Al-containing gas supply source 51a to the gas supply line 51b is stored in the storage tank 51d, and the pressure in the storage tank 51d is increased. In addition, by closing the valve 51e, the carrier gas (N$_2$) supplied from the gas supply line 53b and the gas supply line 57b also functions as a purge gas, and the excess Al-containing gas may be exhausted (step S12).

After a predetermined time (e.g., 0.05 to 5 seconds) elapses after the valve 51e is closed, the control part 6 opens the valve 55e so as to supply the NH$_3$ gas stored in the storage tank 55d into the processing container 1 and to reduce the Al-containing gas adsorbed on the surface of the wafer W (step S13).

After a predetermined time (e.g., 0.05 to 5 seconds) elapses after the valve 55e is opened, the control part 6 closes the valve 55e so as to stop the supply of the NH$_3$ gas into the processing container 1 (step S14). By closing the valve 55e, the NH$_3$ gas supplied from the NH$_3$ gas supply source 55a to the gas supply line 55b is stored in the storage tank 55d, and the pressure in the storage tank 55d is increased. In addition, by closing the valve 51e, the carrier gas (N$_2$) supplied from the gas supply line 53b and the gas supply line 57b also functions as a purge gas, and the excess Al-containing gas may be exhausted (step S14).

The control part 6 repeats the cycle of steps S11 to S14 for multiple cycles (e.g., 10 to 1000 cycles) so as to form an AlN film having a desired film thickness. For example, when AlCl$_3$ gas is used as the Al-containing gas, it reacts as follows: AlCl$_3$+NH$_3$→AlN+HCl↑ and AlN is adsorbed on the surface of the wafer W. In addition, for example, when TMA gas is used as the Al-containing gas, it reacts as follows: C$_6$H$_{18}$Al$_2$+NH$_3$→AlN+C$_x$H$_y$↑ and AlN is adsorbed on the surface of the wafer W.

The gas supply sequence and the conditions of process gases when forming an AlN film shown in FIG. 7 are merely examples, and are not limited thereto. Other gas supply sequences and process conditions of process gases may be used to form an AlN film.

[Formation of Initial Tungsten Film]

Figure 8:
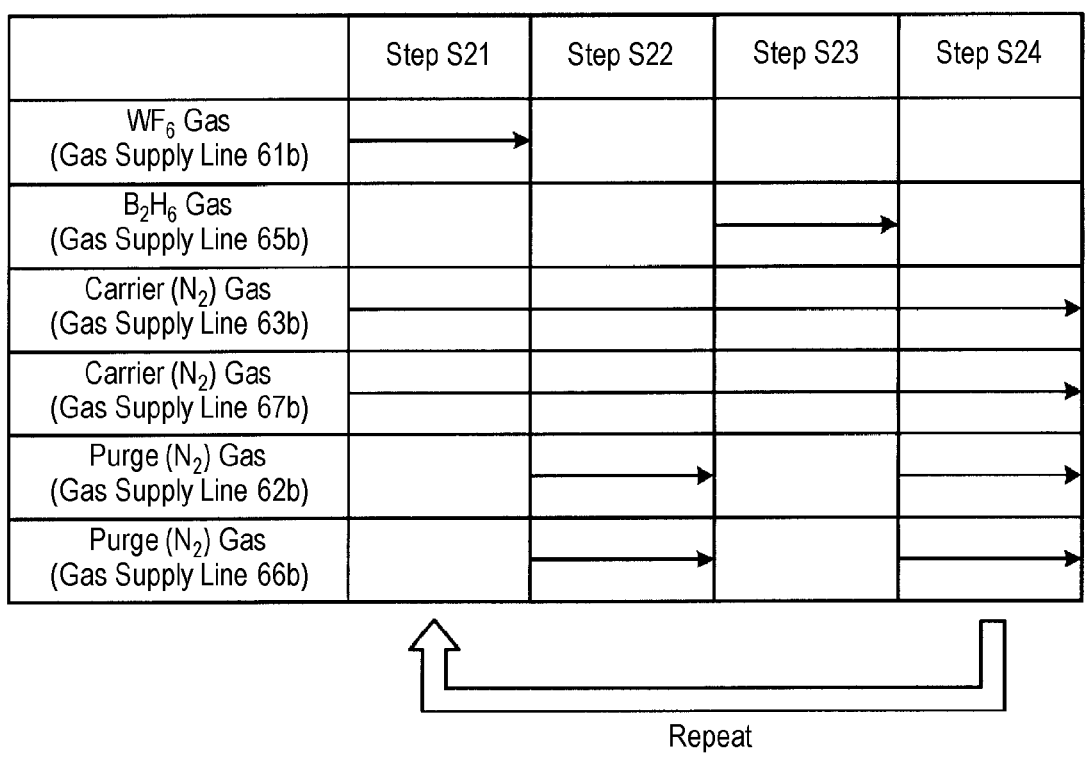
FIG. 8 is a view illustrating a gas supply sequence when forming an initial tungsten film according to an embodiment.

Next, a flow of forming an initial tungsten film by the second film forming apparatus 102 will be described. FIG. 8 is a view illustrating a gas supply sequence when forming an initial tungsten film according to an embodiment.

The control part 6 of the second film forming apparatus 102 controls the heater 21 of the mounting table 2 so as to heat a wafer W to a predetermined temperature (e.g., 250 to 650 degrees C.). In addition, the control part 6 controls the pressure control valve of the exhaust mechanism 42 so as to adjust the inside of the processing container 1 to a predetermined pressure (e.g., $1.3 \times 10^1$ to $8.0 \times 10^3$ Pa).

The control part 6 opens the valves 63e and 67e, and supplies a carrier gas (N$_2$ gas) of a predetermined flow rate (e.g., 100 to 8000 sccm) from the N$_2$ gas supply sources 63a and 67a to the gas supply lines 63b and 67b, respectively. In addition, the control part 6 supplies WF$_6$ gas and B$_2$H$_6$ from the metal material gas supply source 61a and the boron-containing gas supply source 65a to the gas supply lines 61b and 65b, respectively. At this time, since the valves 61e and 65e are closed, the WF$_6$ gas and the B$_2$H$_6$ gas are respectively stored in the storage tanks 61d and 65d, and the pressure in the storage tanks 61d and 65d is increased.

Next, the control part 6 opens the valve 61e and supplies the WF$_6$ gas stored in the storage tank 61d into the processing container 1 so as to be adsorbed on the surface of the wafer W (step S21). Further, in parallel with the supply of the WF$_6$ gas into the processing container 1, the control part 6 supplies the purge gas (N$_2$ gas) from the N$_2$ gas supply sources 62a and 66a to the gas supply lines 62b and 66b, respectively. At this time, by closing the valves 62e and 66e, the purge gas is stored in the storage tanks 62d and 66d, and the pressure in the storage tanks 62d and 66d is increased.

After a predetermined time (e.g., 0.05 to 5 seconds) elapses after the valve 61e is opened, the control part 6 closes the valve 61e so as to stop the supply of the WF$_6$ gas into the processing container 1. In addition, the control part 6 opens the valves 62e and 66e, and supplies the purge gas stored in each of the storage tanks 62d and 66d into the processing container 1 (step S22). At this time, since the purge gas is supplied from the storage tanks 62d and 66d in the state of increased pressure, the purge gas is supplied into the processing container 1 at a relatively large flow rate, for example, a flow rate (for example, 500 to 10000 sccm) larger than the flow rate of the carrier gas. Therefore, the WF$_6$ gas remaining in the processing container 1 is quickly discharged to the exhaust pipe 41, and the atmosphere inside the processing container 1 is replaced from the WF$_6$ gas atmosphere to the atmosphere containing N$_2$ gas within a short time. Meanwhile, by closing the valve 61e, the WF$_6$ gas supplied from the metal material gas supply source 61a to the gas supply line 61b is stored in the storage tank 61d, and the pressure in the storage tank 61d is increased.

After a predetermined time (e.g., 0.05 to 5 seconds) elapses after the valves 62e and 66e are opened, the control part 6 closes the valves 62e and 66e so as to stop the supply of the purge gas into the processing container 1. In addition, the control part 6 opens the valve 65e and supplies the B$_2$H$_6$ gas stored in the storage tank 65d into the processing container 1 so as to reduce the WF$_6$ gas adsorbed on the surface of the wafer W (step S23). At this time, by closing the valves 62e and 66e, the purge gas supplied from the N$_2$ gas supply sources 62a and 66a to the gas supply lines 62b and 66b are stored in the storage tanks 62d and 66d, and the pressure in the storage tanks 62d and 66d is increased.

After a predetermined time (e.g., 0.05 to 5 seconds) elapses after the valve 65e is opened, the control part 6 closes the valve 65e so as to stop the supply of the B$_2$H$_6$ gas into the processing container 1. In addition, the control part 6 opens the valves 62e and 66e, and supplies the purge gas stored in each of the storage tanks 62d and 66d into the processing container 1 (step S24). At this time, since the purge gas is supplied from the storage tanks 62d and 66d in the state of increased pressure, the purge gas is supplied into the processing container 1 at a relatively large flow rate, for example, a flow rate (for example, 500 to 10000 sccm) larger than the flow rate of the carrier gas. Therefore, the B$_2$H$_6$ gas remaining in the processing container 1 is quickly discharged to the exhaust pipe 41, and the atmosphere inside the processing container 1 is replaced from the B$_2$H$_6$ gas atmosphere to the atmosphere containing N$_2$ gas within a short time. Meanwhile, by closing the valve 65e, the B$_2$H$_6$ gas supplied from the boron-containing gas supply source 65a to the gas supply line 65b is stored in the storage tank 65d, and the pressure in the storage tank 65d is increased.

The control part 6 repeats the cycle of steps S21 to S24 for multiple cycles (e.g., 50 to 2000 cycles) so as to form an initial tungsten film having a desired film thickness.

In addition, the gas supply sequence and the conditions of process gases when forming an initial tungsten film shown in FIG. 8 are merely examples, and are not limited thereto. Other gas supply sequences and process conditions of process gases may be used to form the initial tungsten film.

[Formation of Main Tungsten Film]
[Formation of Initial Tungsten Film]

Figure 9:
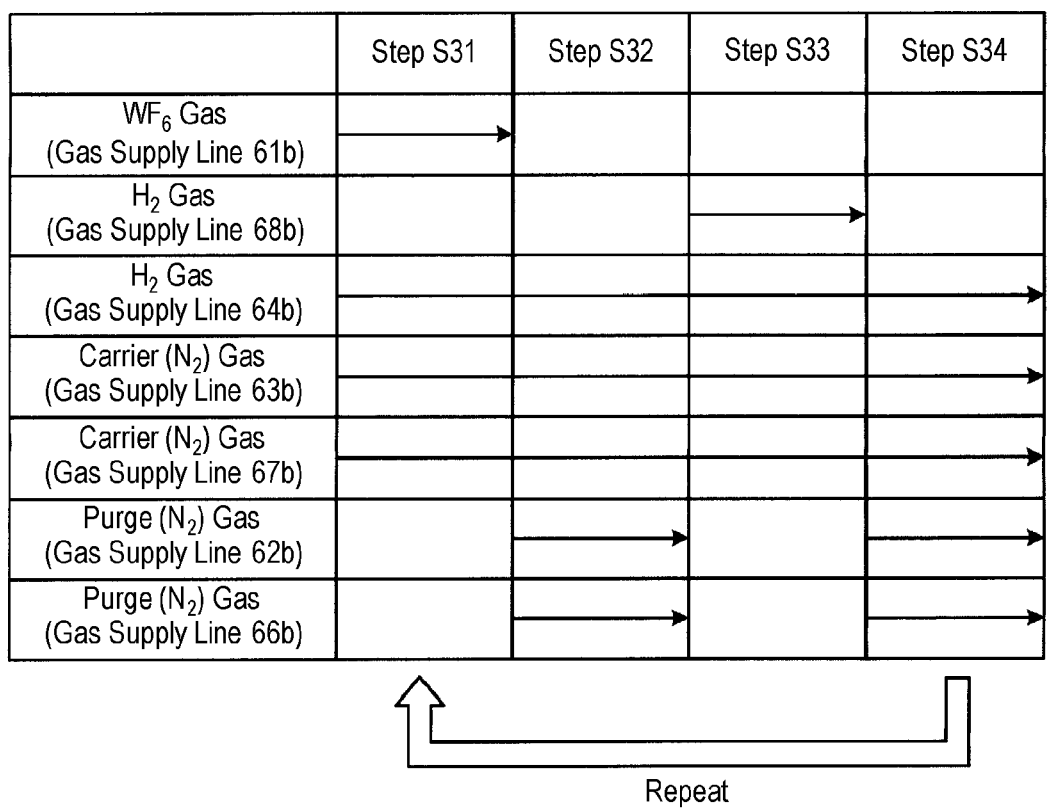
FIG. 9 is a view illustrating a gas supply sequence when forming a main tungsten film according to an embodiment.

Next, a flow of forming a main tungsten film by the third film forming apparatus 103 will be described. FIG. 9 is a view illustrating a gas supply sequence when forming a main tungsten film according to an embodiment.

The control part 6 of the third film forming apparatus 103 controls the heater 21 of the mounting table 2 so as to heat a wafer W to a predetermined temperature (e.g., 250 to 650 degrees C.). In addition, the control part 6 controls the pressure control valve of the exhaust mechanism 42 so as to adjust the inside of the processing container 1 to a predetermined pressure (e.g., $1.3 \times 10^1$ to $8.0 \times 10^3$ Pa).

The control part 6 opens the valves 63e and 67e, and supplies a carrier gas ($N_2$ gas) of a predetermined flow rate (e.g., 100 to 8000 sccm) from the $N_2$ gas supply sources 63a and 67a to the gas supply lines 63b and 67b, respectively. In addition, the control part 6 opens the valve 64e, and supplies $H_2$ gas of a predetermined flow rate (e.g., 100 to 20000 sccm) from the $H_2$ gas supply sources 64a to the gas supply lines 64b. In addition, the control part 6 supplies $WF_6$ gas and $H_2$ gas from the metal material gas supply source 61a and the $H_2$ gas supply source 68a to the gas supply lines 61b and 68b, respectively. At this time, since the valves 61e and 68e are closed, the $WF_6$ gas and the $H_2$ gas are respectively stored in the storage tanks 61d and 68d, and the pressure in the storage tanks 61d and 68d is increased.

Next, the control part 6 opens the valve 61e and supplies the $WF_6$ gas stored in the storage tank 61d into the processing container 1 so as to be adsorbed on the surface of the wafer W (step S31). Further, in parallel with the supply of the $WF_6$ gas into the processing container 1, the control part 6 supplies the purge gas ($N_2$ gas) from the $N_2$ gas supply sources 62a and 66a to the gas supply lines 62b and 66b, respectively. At this time, by closing the valves 62e and 66e, the purge gas is stored in the storage tanks 62d and 66d, and the pressure in the storage tanks 62d and 66d is increased.

After a predetermined time (e.g., 0.05 to 5 seconds) elapses after the valve 61e is opened, the control part 6 closes the valve 61e so as to stop the supply of the $WF_6$ gas into the processing container 1. In addition, the control part 6 opens the valves 62e and 66e, and supplies the purge gas stored in each of the storage tanks 62d and 66d into the processing container 1 (step S32). At this time, since the purge gas is supplied from the storage tanks 62d and 66d in the state of increased pressure, the purge gas is supplied into the processing container 1 at a relatively large flow rate, for example, a flow rate (for example, 500 to 10000 sccm) larger than the flow rate of the carrier gas. Therefore, the $WF_6$ gas remaining in the processing container 1 is quickly discharged to the exhaust pipe 41, and the atmosphere inside the processing container 1 is replaced from the $WF_6$ gas atmosphere to the atmosphere containing $H_2$ gas and $N_2$ gas within a short time. Meanwhile, by closing the valve 61e, the $WF_6$ gas supplied from the metal material gas supply source 61a to the gas supply line 61b is stored in the storage tank 61d, and the pressure in the storage tank 61d is increased.

After a predetermined time (e.g., 0.05 to 5 seconds) elapses after the valves 62e and 66e are opened, the control part 6 closes the valves 62e and 66e so as to stop the supply of the purge gas into the processing container 1. In addition, the control part 6 opens the valve 68e and supplies the $H_2$ gas stored in the storage tank 68d into the processing container 1 so as to reduce the $WF_6$ gas adsorbed on the surface of the wafer W (step S33). At this time, by closing the valves 62e and 66e, the purge gas supplied from the $N_2$ gas supply sources 62a and 66a to the gas supply lines 62b and 66b are stored in the storage tanks 62d and 66d, and the pressure in the storage tanks 62d and 66d is increased.

After a predetermined time (e.g., 0.05 to 5 seconds) elapses after the valve 68e is opened, the control part 6 closes the valve 68e so as to stop the supply of the $H_2$ gas into the processing container 1. In addition, the control part 6 opens the valves 62e and 66e, and supplies the purge gas stored in each of the storage tanks 62d and 66d into the processing container 1 (step S34). At this time, since the purge gas is supplied from the storage tanks 62d and 66d in the state of increased pressure, the purge gas is supplied into the processing container 1 at a relatively large flow rate, for example, a flow rate (for example, 500 to 10000 sccm) larger than the flow rate of the carrier gas. Therefore, the $H_2$ gas remaining in the processing container 1 is quickly discharged to the exhaust pipe 41, and the atmosphere inside the processing container 1 is replaced from the $H_2$ gas atmosphere to the atmosphere containing $H_2$ gas and $N_2$ gas within a short time. Meanwhile, by closing the valve 68e, the $H_2$ gas supplied from the $H_2$ gas supply source 68a to the gas supply line 68b is stored in the storage tank 68d, and the pressure in the storage tank 68d is increased.

The control part 6 repeats the cycle of steps S31 to S34 for multiple cycles (e.g., 50 to 2000 cycles) so as to form a main tungsten film having a desired film thickness.

In addition, the gas supply sequence and the conditions of process gases when forming a main tungsten film shown in FIG. 9 are merely examples, and are not limited thereto. Other gas supply sequences and process conditions of process gases may be used to form the main tungsten film.

[Action and Effect]

Figure 10:
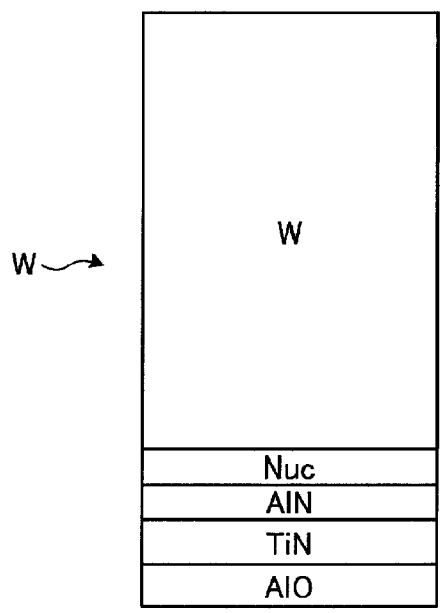
FIG. 10 is a view illustrating an example of the layer configuration of a wafer according to the present embodiment.

Next, the action and effects of a film forming method according to the present embodiment will be described. FIG. 10 is a view illustrating an example of the layer configuration of a wafer according to the present embodiment. FIG. 10 illustrates an example of the layer configuration of a wafer W formed by the film forming method according to the present embodiment. In the wafer W, an AlO layer is formed on a silicon ($SiO_2$) layer for blocking, and a TiN film having a thickness of, for example, 1 nm is formed on the AlO layer for the sake adhesion and reaction suppression. Then, in the wafer W, an AlN film having a thickness of, for example, 1 nm is formed on the TiN film by the film forming method according to the present embodiment, and a tungsten nucleation film (Nuc) having a thickness of, for example, 1 nm is formed on the AlN film as an initial tungsten film. Then, in the wafer W, a low-resistance main tungsten film (W) is formed on the nucleation film.

Here, examples of process conditions of the film forming method according to the present embodiment will be collectively described below.

AlN film
Temperature: 250 to 550 degrees C.
Pressure: 0.1 to 10 Torr
Al-containing gas: 10 to 500 sccm
Carrier gas ($N_2$): 1000 to 10000 sccm
Purge gas ($N_2$): 0 to 10000 sccm
$NH_3$ gas: 1000 to 10000 sccm
Time:
Al-containing gas: 0.05 to 5 sec
Purge: 0.05 to 5 sec
$NH_3$ gas: 0.05 to 5 sec
Purge: 0.05 to 5 sec
Initial tungsten film (nucleation film):
Temperature: 150 to 550 degrees C.
Pressure: 1 to 100 Torr
W-containing gas: 10 to 500 sccm
Carrier gas ($N_2$): 1000 to 10000 sccm
Purge gas ($N_2$): 0 to 10000 sccm
$B_2H_6$ gas: 10 to 1000 sccm
Time:

W-containing gas: 0.05 to 15 sec
Purge: 0.05 to 15 sec
B$_2$H$_6$ gas: 0.05 to 15 sec
Purge: 0.05 to 15 sec
   Main tungsten film
Temperature: 250 to 550 degrees C.
Pressure: 0.1 to 20 Torr
W-containing gas: 100 to 500 sccm
Carrier gas (N$_2$): 1000 to 10000 sccm
Purge gas (N$_2$): 0 to 10000 sccm
H$_2$ gas: 500 to 20000 sccm
Time:
W-containing gas: 0.05 to 15 sec
Purge: 0.05 to 15 sec
H$_2$ gas: 0.05 to 15 sec
Purge: 0.05 to 15 sec In the wafer W, by forming an AlN film on a TiN film before the film formation of tungsten as described above, the AlN film is able to cancel the orientation of the TiN film. The thickness of the AlN film is preferably about 1 to 2 nm. With the thickness of about 1 nm, it is possible to cancel the orientation of the base TiN film. Thus, in the wafer W, it is possible to grow larger the grains of a tungsten film to be formed, so that the resistance of the tungsten film can be reduced.

In addition, by forming the Nucleation film on the wafer W, it is possible to enhance the adhesion of tungsten film to be formed. In addition, it is possible to improve the uniformity of the tungsten film to be formed. The thickness of the nucleation film is preferably about 0.5 to 5 nm.

Figure 11:
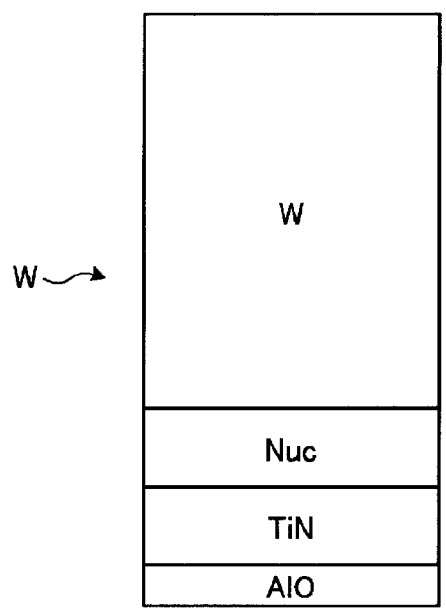
FIG. 11 is a view illustrating an example of the layer configuration of a wafer according to a first comparative example.

Here, effects will be described using a comparative example. FIG. 11 is a view illustrating an example of the layer configuration of a wafer according to a first comparative example. FIG. 11 illustrates an example of the layer configuration of a conventional wafer W as a first comparative example. In the wafer W, an AlO layer is formed on a silicon (SiO$_2$) layer for blocking, and a TiN film having a thickness of, for example, 2 nm is formed on the AlO layer for the sake of adhesion and reaction suppression. Then, in the wafer W, a tungsten nucleation film (Nuc) having a thickness of, for example, 3 nm is formed on the TiN film. Then, in the wafer W, a low-resistance tungsten film (W) is formed on the nucleation film.

Below, examples of process conditions for forming respective films of first comparative example will be described.

Figure 12:
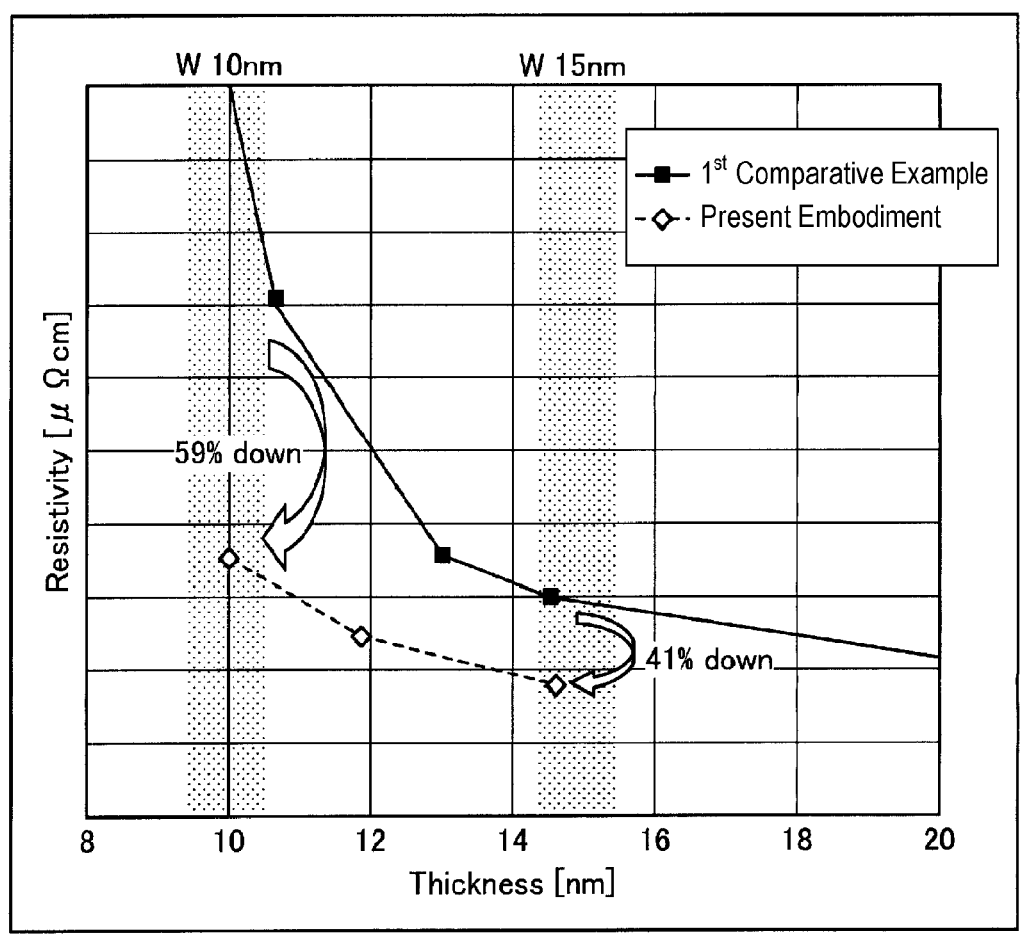
FIG. 12 is a view illustrating an example of a change in resistivity with respect to the thickness of a tungsten film.

Nucleation Film
Temperature: 150 to 550 degrees C.
Pressure: 1 to 100 Torr
W-containing gas: 10 to 500 sccm
Carrier gas (N$_2$): 1000 to 10000 sccm
Purge gas (N$_2$): 0 to 10000 sccm
H$_2$ gas: 500 to 20000 sccm
SiH$_4$ gas: 10 to 1000 sccm
Time:
W-containing gas: 0.05 to 15 sec
Purge: 0.05 to 15 sec
SiH$_4$ gas: 0.05 to 15 sec
Purge: 0.05 to 15 sec
   W Film
Temperature: 250 to 550 degrees C.
Pressure: 0.1 to 20 Torr
W-containing gas: 100 to 500 sccm
Carrier gas (N$_2$): 1000 to 10000 sccm
Purge gas (N$_2$): 0 to 10000 sccm
H$_2$ gas: 500 to 20000 sccm
Time:
W-containing gas: 0.05 to 15 sec
Purge: 0.05 to 15 sec
H$_2$ gas: 0.05 to 15 sec
Purge: 0.05 to 15 sec FIG. 12 is a view illustrating an example of a change in resistivity with respect to a thickness of a tungsten film. FIG. 12 shows changes in resistivity with respect to thicknesses of tungsten films in the layer configuration of the present embodiment shown in FIG. 10 and the layer configuration of the first comparative example illustrated in FIG. 11. In the example of FIG. 12, the thickness of each tungsten film is measured from the interface with the TiN film. That is, in the layer configuration of the present embodiment, the thicknesses of the AlN film, the nucleation film (Nuc), and the tungsten film (W) are taken as the thickness of the tungsten film. In the layer configuration of the first comparative example, the thicknesses of the AlN film, the nucleation film (Nuc), and the tungsten film (W) are taken as the thickness of the tungsten film. In addition, in the example of FIG. 12, the resistivity is shown normalized with reference to the resistivity of the first comparative example in the case where the thickness is 10 nm. As shown in FIG. 12, when the thickness is 10 nm, the resistivity in the layer configuration of the present embodiment is reduced by 59% compared that in the layer configuration of the first comparative example. In addition, when the thickness is 15 nm, the resistivity of the layer configuration of the present embodiment is reduced by 41% compared with the layer configuration of the first comparative example.

Here, in an LSI, a wiring line is miniaturized, and a reduction in resistance in the wiring line is required. For example, in a three-dimensional stacked semiconductor memory such as 3D NAND flash memory, although a tungsten film is formed as a word line, further reduction in resistance of the tungsten film is required for miniaturization.

In contrast, in the layer configuration of the present embodiment, it is possible to achieve the low resistance of the tungsten film even when the film thickness is reduced.

In addition, the applicant has found that it is possible to reduce stress in a metal layer by forming an initial metal film by supplying a metal material gas and a boron-containing gas to a substrate having a cancel layer formed on a base film, and forming a main metal film on the initial metal film. For example, the stress in a tungsten layer is reduced by supplying WF$_6$ gas and B$_2$H$_6$ gas to a wafer W having an AlN film formed on a TiN film to form an initial tungsten film, and forming a main tungsten film on the substrate on which the initial tungsten film is formed, as in the present embodiment.

Effects will be described using a comparative example. For example, in forming the initial tungsten film of the layer configuration of the wafer W shown in FIG. 10, SiH$_4$ gas is supplied instead of B$_2$H$_6$ gas so as to form a second comparative example.

Figure 13:
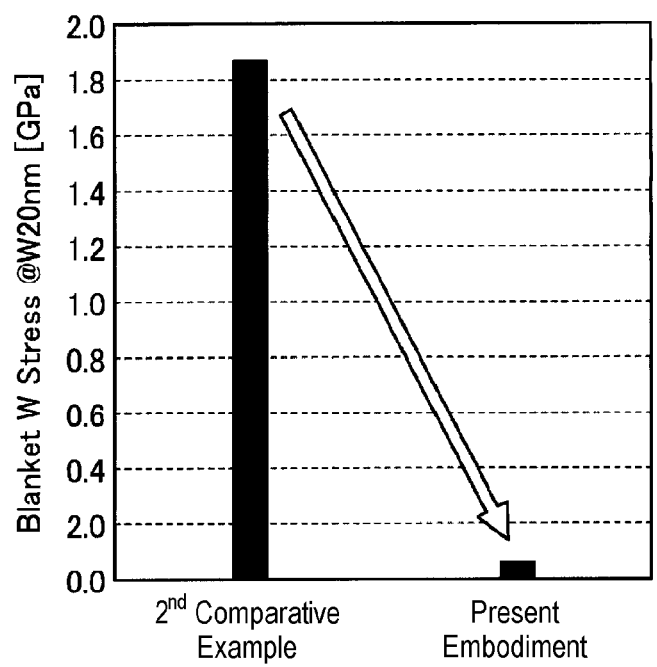
FIG. 13 is a view illustrating an example of the comparison result of stress in a tungsten layer according to an embodiment.

FIG. 13 is a view illustrating an example of the comparison result of stress in a tungsten layer according to an embodiment. FIG. 13 shows a comparison result between the stress in the layer configuration of the present embodiment and the stress in the layer configuration of the second comparative example. In the layer configuration of the present embodiment, the stress in the tungsten layer is 0.1 GPa or less. In the layer configuration of the second comparative example, the stress in the tungsten layer is 1.8 GPa or more. As described above, in the layer configuration of the present embodiment, the stress is significantly reduced compared with that in the layer configuration of the second comparative example. When stress is reduced in the wafer W, for example, the occurrence of deformation such as warpage is suppressed. As described above, by suppressing the occurrence of warpage or the like of the wafer W, it is possible to suppress deterioration in positional accuracy, for example, in the case of performing photolithography on the wafer W.

Figure 14:
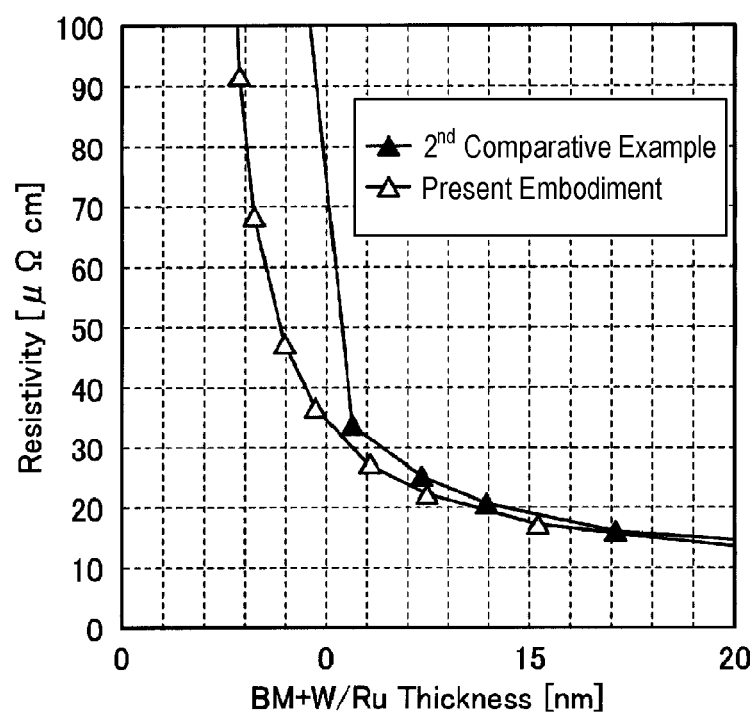
FIG. 14 is a view illustrating an example of a change in resistivity with respect to the thickness of a tungsten film according to the embodiment.

In addition, in the layer configuration of the present embodiment, as in the layer configuration of the second comparative example, it is possible to realize low resistance of the metal layer. FIG. 14 is a view illustrating an example of a change in resistivity with respect to the thickness of a tungsten film according to an embodiment. FIG. 14 shows changes in resistivity with respect to thicknesses of the tungsten film in the layer configuration of the present embodiment and the layer configuration of the second comparative example. With the layer configuration of the present embodiment, it is possible to realize low resistance more than or equal to that achieved with the layer configuration of the second comparative example.

As described above, in the film forming method according to the present embodiment, a cancel layer (AlN film) is formed on a wafer W, which is disposed in the processing container 1 and on which a base film (TiN film) is formed, so as to cancel the orientation of a base film. In the film forming method, an initial metal film (initial tungsten film) is formed by supplying a metal material gas and a boron-containing gas to the wafer W on which the cancel layer is formed. In the film forming method, a main metal film (main tungsten film) is formed on the wafer W on which the initial metal film is formed. Thus, with the film forming method according to the present embodiment, it is possible to reduce the stress in the metal layer while achieving the low resistance of the metal layer even when the film thickness of the metal layer is reduced.

Further, the film forming method according to the present embodiment includes any of $WF_6$ and $WCl_x$ as the metal material gas, and includes any of $B_2H_6$ and BCl as the boron-containing gas. Thus, with the film forming method according to the present embodiment, it is possible to form a tungsten film. Further, with the film forming method according to the present embodiment, it is possible to reduce the stress in the tungsten film while achieving the low resistance of the tungsten film even when the film thickness of the tungsten is reduced.

In the film forming method according to the present embodiment, the thickness of the initial metal film is set to 0.5 to 5 nm. Thus, with the film forming method according to the present embodiment, it is possible to achieve low resistance in a tungsten film even when the film thickness is reduced, while improving the uniformity of a main tungsten film to be formed.

In addition, in the film forming method according to the present embodiment, the metal to be formed as a film is tungsten, and in the step of forming a main metal film, the main metal film is formed by supplying a W-containing gas and an H-containing gas. Thus, with the film forming method according to the present embodiment, it is possible to form a main tungsten film having low stress.

Further, in the film forming method according to the present embodiment, the W-containing gas includes any of $WF_6$ and $WCl_x$ and the H-containing gas includes any of $H_2$, $SiH_4$, and $B_2H_6$. Thus, with the film forming method according to the present embodiment, it is possible to form a main tungsten film having low stress.

Although embodiments have been described above, it should be understood that the embodiments disclosed herein are illustrative and non-restrictive in all respects. Indeed, the above-described embodiments can be implemented in various forms. In addition, the embodiments described above may be omitted, replaced, or modified in various forms without departing from the scope and spirit of the claims.

Figure 15:
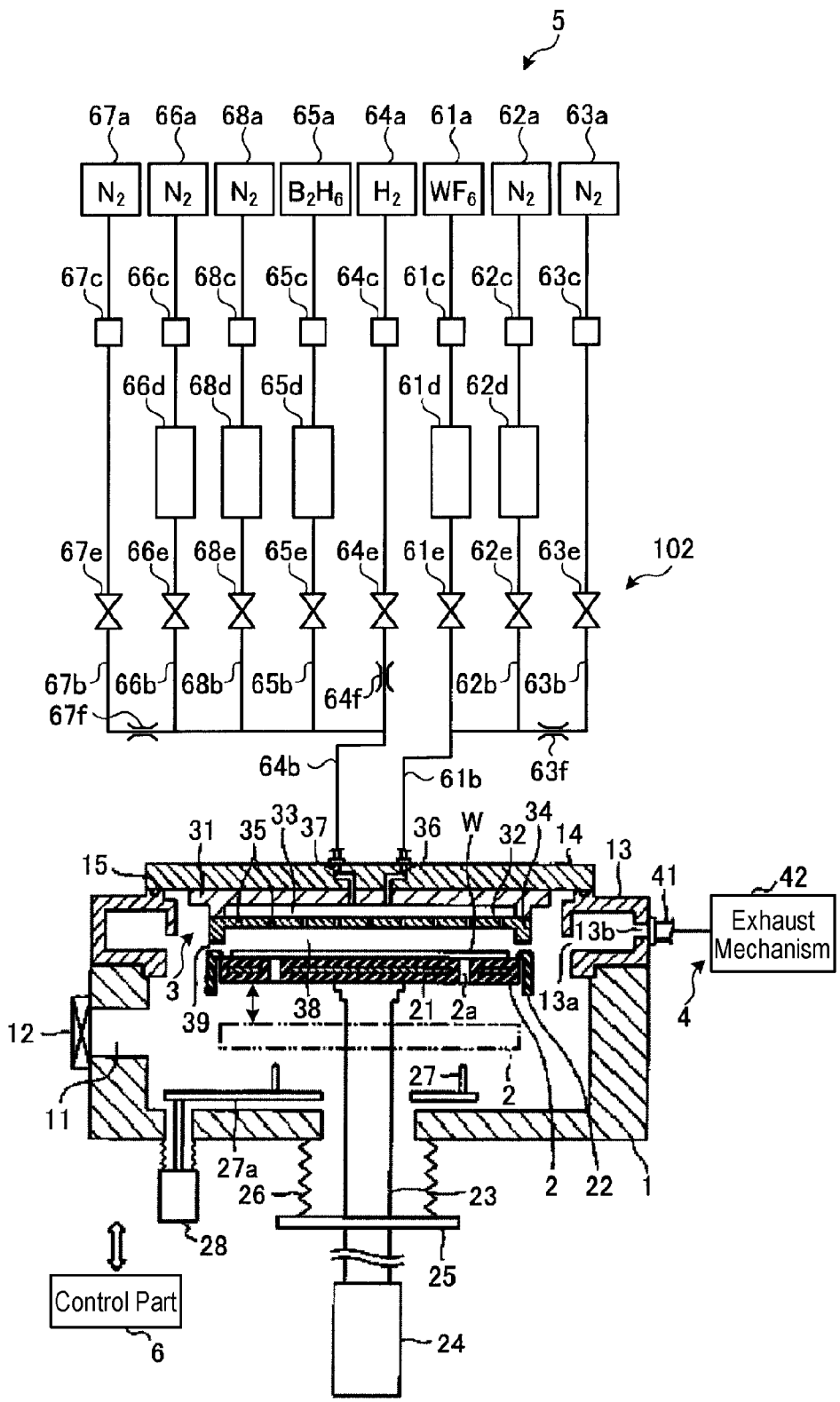
FIG. 15 is a cross-sectional view illustrating an example of a schematic configuration of a film forming apparatus according to another embodiment.

For example, in the film forming system 100 according to the present embodiment, a case in which the initial tungsten film is formed by the second film forming apparatus 102 and the main tungsten film is formed by the third film forming apparatus 103 has been described by way of an example, but the present disclosure is not limited thereto. For example, in the film forming system 100, the initial tungsten film and the main tungsten film may be formed in the same film forming apparatus. For example, in the film forming system 100, the second film forming apparatus 102 and the third film forming apparatus 103 may form the initial tungsten film and the main tungsten film. In this case, the second film forming apparatus 102 and the third film forming apparatus 103 may have the configurations of the gas supply mechanisms 5 illustrated in FIGS. 3 and 4 together. FIG. 15 is a cross-sectional view illustrating an example of a schematic configuration of a film forming apparatus according to another embodiment. The second film forming apparatus 102 illustrated in FIG. 15 has the configuration of the gas supply mechanism 5 illustrated in FIG. 4 in addition to the configuration of the gas supply mechanism 5 illustrated in FIG. 3. In the film forming system 100, by forming the initial tungsten film and the main tungsten film in the second film forming apparatus 102 and the third film forming apparatus 103, respectively, it is possible to eliminate the transfer time of the wafer W between the film forming apparatuses between the film formation of the initial tungsten film and the main tungsten film, and thus productivity is improved.

In addition, in the film forming system 100 according to the embodiment, a case in which the base film is formed by the base-film forming apparatus 201 and the cancel layer is formed by the first film forming apparatus 101 has been described by way of an example, but the present disclosure is not limited thereto. For example, in the film forming system 100, the base film and the cancel layer may be formed in the same film forming apparatus.

In addition, in the film forming system 100, the base film, the cancel layer, initial tungsten film, and the main tungsten film may be formed in the same film forming apparatus. In this case, it is possible to eliminate the transfer time of the wafer W between the film forming apparatuses, and thus productivity is improved.

In addition, in the film forming system 100 according to the embodiment, a case in which the base film is formed by the base-film forming apparatus 201 and the cancel layer is formed by the first film forming apparatus 101 has been described by way of an example, but the present disclosure is not limited thereto. For example, in the film forming system 100, the base film may be formed in a base-film forming apparatus in another film forming system.

In addition, in the film forming system 100 according to the embodiment, a case in which the base film is formed by the base-film forming apparatus 201 and the cancel layer is formed by the first film forming apparatus 101 has been described by way of an example, but the present disclosure is not limited thereto. For example, the number of film forming apparatuses may be appropriately changed in consideration of productivity and the like.

Although a semiconductor wafer has been described as an example of a substrate, the semiconductor wafer may be silicon or a compound semiconductor such as GaAs, SiC, or GaN. Furthermore, the substrate is not limited to the semiconductor wafer, and may be applied to a glass substrate used for FPD (flat panel display) such as a liquid crystal display device, a ceramic substrate, and the like.

According to the present disclosure, it is possible to achieve low resistance and low stress in a metal layer even when a film thickness is reduced.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method comprises:
    forming a cancel layer on a substrate, which is disposed within a processing container and on which a base film is formed, in a pressure-reduced atmosphere, the cancel layer cancelling orientation of the base film;
    forming an initial metal film by supplying a metal material gas and a boron-containing gas to the substrate on which the cancel layer is formed; and
    forming a main metal film on the substrate on which the initial metal film is formed.

2. The film forming method of claim 1, wherein the metal material gas includes any of $WF_6$ and $WCl_X$, and
    the boron-containing gas includes any of $B_2H_6$ and $BCl$.

3. The film forming method of claim 1, wherein a thickness of the initial metal film is set to 0.5 to 5 nm.

4. The film forming method of claim 1, wherein the metal of the initial metal film and the main metal film is tungsten, and
    in the forming the main metal film, the main metal film is formed by supplying a W-containing gas and an H-containing gas.

5. The film forming method of claim 4, wherein the W-containing gas includes any of $WF_6$ and $WCl_X$, and
    the H-containing gas includes any of $H_2$, $SiH_4$, and $B_2H_6$.

6. The film forming method of claim 1, wherein the main metal film has stress of 0.1 GPa or less.

7. The film forming method of claim 1, wherein, in the forming the cancel layer, the cancel layer is formed by supplying an Al-containing gas and an N-containing gas.

8. The film forming method of claim 7, wherein the Al-containing gas includes any of $AlCl_3$ and trimethylaluminum (TMA), and
    the N-containing gas includes any of $N_2$ and $NH_3$.

9. The film forming method of claim 1, wherein a thickness of the cancel layer is set to 1 to 2 nm.

10. The film forming method of claim 1, wherein, in the forming the cancel layer, the forming the initial metal film, and the forming the main metal film, a raw material gas and a reducing gas for reducing the raw material gas are alternately supplied.

11. The film forming method of claim 10, wherein the raw material gas and the reducing gas are alternately supplied with a purge gas supplied therebetween.

12. The film forming method of claim 1, wherein the initial metal film and the main metal film are formed in the same processing container.

13. The film forming method of claim 1, wherein the base film and the cancel layer are formed in the same processing container.

14. The film forming method of claim 1, wherein the base film, the cancel layer, the initial metal film, and the main metal film are formed without being exposed to air.

* * * * *